VARIABLE-TURNOVER-FREQUENCY BASS TONE CONTROL

Filed Sept. 13, 1967 2 Sheets-Sheet 1

INVENTOR.
Wayne M. Schott
By [signature]
Attorney

INVENTOR.
Wayne M. Schott
By John J. Pederson
Attorney

United States Patent Office 3,460,071
Patented Aug. 5, 1969

3,460,071
VARIABLE-TURNOVER-FREQUENCY BASS TONE CONTROL

Wayne M. Schott, Broadview, Ill., assignor to Zenith Radio Corporation, Chicago, Ill., a corporation of Delaware Filed Sept. 13, 1967, Ser. No. 667,442
Int. Cl. H03h *5/08*
U.S. Cl. 333—28 5 Claims

ABSTRACT OF THE DISCLOSURE

A continuously adjustable, variable-turnover-frequency bass tone control circuit which compensates for the reduced low-frequency sensitivity of the ear at low volume levels. The circuit uses no switches or active elements and requires only fixed resistance and capacitance elements in conjunction with a resistance potentiometer.

Background of the invention

This invention invention relates to audio tone control circuitry.

In an electronic audio amplifier it is desirable to be able to select the tonal characteristics of the output signal of the amplifier. This selection is particularly desirable for the listener of a home-entertainment type electronic audio amplifier such as one generally used in conjunction with a high fidelity phonograph. Such a control enables the listener to adjust the tonal response range of the output signal of the amplifier to satisfy personal tastes as well as to compensate for tonal variations in the program material.

Conventional audio tone controls adjust the amplitude of high (treble) and low (bass) frequencies relative to the middle (mid-range) frequencies of the audible frequency spectrum (20–20,000 hertz). The bass range of frequencies is approximately 20 to 500 hertz; mid-range, 500 to 2,000 hertz; and treble, 2,000 to 20,000 hertz. Emphasizing the signal level of the frequencies (bass or treble) to a level higher than the signal level of the mid-range frequencies is referred to as boosting whereas de-emphasing the signal level of the range of frequencies to a level lower than the signal level of the mid-range frequencies is called cutting. For optimum results as well as convenience, these operations of boosting and cutting are conventionally performed by two separate controls, one for treble frequencies and one for bass. With each tone control it is desirable to be able to boost and cut, depending on the setting of the control, the corresponding range of frequencies relative to the mid-range frequencies. Preferably, the adjusting of the signal level of the bass and/or treble frequencies does not affect the signal level of the mid-range frequencies.

The most desirable bass tone control has one additional requirement. At high volume levels the sensitivity of the ear requires bass-boost compensation only at frequencies in the range of 20 to 200 hertz. This is not true at low volume levels. Here the human ear requires bass-boost compensation at frequencies in the range from 20 to 500 hertz. Conventional bass tone controls boost both 20 to 200 hertz and 200 to 500 hertz frequency ranges the same degree. Thus the conventional control performs adequately at low volume levels. However, when an audio amplifier utilizing a conventional bass control is operated at a high volume level with the proper degree of emphasis for the 20 to 200 hertz range, the 200 to 500 hertz range is boosted too much. Since conventional sound reproduction systems used in a private home are typically operated at both high and low volume levels, an additional type of bass frequency compensation besides the mere boosting of the bass range of frequencies is required. This additional requirement is the capability of being able to boost the 200 to 500 hertz frequency range to a lesser degree than the 20 to 200 hertz frequency range when the amplifier is operated at a high volume level. The failure to provide this additional frequency compensation results in an output audio signal with the 200 to 500 hertz frequency range boosted too much and, consequently, in an audio output signal with a less-than-satisfactory degree of intelligibility. The term of art for this undesirable result is "muddy bass."

In the typical situation of an individual listening to a conventional sound reproduction system in his home, the listener operates his system at a reduced volume level. In order to obtain a more natural sounding reproduction, he increases the amount of bass-boost in his amplifier (usually to the maximum-boost position) and in most cases he is able to boost the bass range of frequencies adequately. However, should he desire to increase the volume to a high level, the 200–500 hertz range will be boosted too much and the sound reproduction will suffer from "muddy bass." If he attempts to alleviate this condition by reducing the amount of bass-boost with his conventional tone control, he will also reduce the 20–200 hertz range, thereby creating an unnatural sound reproduction. Thus the listener is torn between two undesirable situations: adequate 20 to 200 hertz compensation and "muddy bass" or no "muddy bass" but inadequate 20 to 200 hertz compensation.

What is needed, then, is a control which changes the range of frequencies being boosted, depending on the setting of the control, with boosting beginning at a higher frequency as the amount of bass-boost is increased. Such a bass tone control is sometimes referred to as a variable-turnover-frequency bass tone control. The turnover frequency for a tone control is the frequency at which the control begins to function (cut or boost) and is defined as being the frequency at which the signal level is three decibels greater (or less) than the signal level of the mid-range frequencies.

A variable-turnover-frequency bass tone control may be achieved by utilizing multi-contact switches. Such switches enable precise values of cut or boost to be inserted at any setting and simplify the associated circuit design because the components may be selected for each switch position to yield the exact amount of cut or boost desired. However a switch-type tone control lacks flexibility and is relatively expensive. A stepless control may be achieved by a circuit utilizing a variable capacitor. Unfortunately, a variable capacitor capable of operating satisfactorily over the entire bass frequency range is quite large physically and is consequently somewhat cumbersome and expensive. Therefore, a variable-turn-over-frequency bass tone control which has the operational capability of the multi-contact switch circuit and the flexibility of the continuously variable capacitor circuit without the cost and size disadvantages of each is quite desirable.

It is therefore an important object of the present invention to devise a new and improved continuously variable passive audio tone control circuit in which the bass components of the audio signal are either emphasized or de-emphasized relative to the other components of the audio signal.

It is a further object of this invention to provide a continuously adjustable passive audio tone control circuit in which the turnover frequency rises as the control is adjusted from the mid-rotation to the maximum-boost position.

Summary of the invention

An audio tone control circuit for providing a bass-boost effect over different portions of the tonal response range for different control settings comprises a pair of input terminals for receiving an audio frequency signal, and a potentiometer having at least two fixed taps and a variable tap. First and second resistors are respectively coupled between the fixed taps and one of the input terminals. A resistance-capacitance network is coupled between one of the fixed taps and the other of the input terminals. An additional capacitor coupled between the variable tap and the other input terminal is also provided. An audio output signal, in which the frequency range of the bass-boost effect is dependent on the setting of the variable tap, is developed between the variable tap and the other input terminal.

Brief description of the drawings

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

Description of the preferred embodiment

Figure 1:
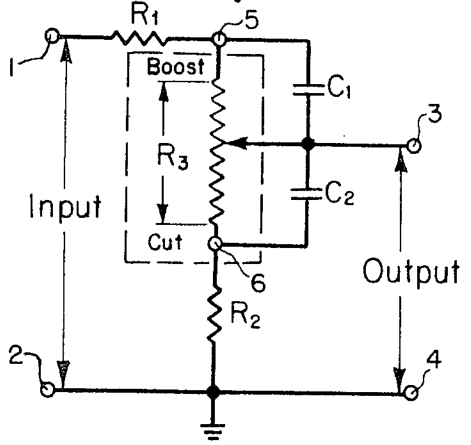
FIG. 1 (PRIOR ART)
FIGURE 1 is a schematic diagram of a conventional bass tone control circuit.

The circuit in FIGURE 1 represents a conventional passive bass tone control circuit, otherwise known as the "universal" bass tone control circuit. This continuously variable control is used to provide both bass cut and bass-boost. An audio frequency signal is applied to input terminals 1 and 2. Capacitors $C_1$ and $C_2$ and to provide a relatively low impedance path for mid-range and treble frequencies while providing a relatively high impedance path for bass frequencies. Their values are selected such that when the variable tap (also referred to as the wiper arm) of potentiometer $R_3$ is positioned at the mid-rotation position, the output signal is "flat," that is, the signal levels of the bass, mid-range, and treble frequencies at the output terminals 3 and 4 are approximately the same. As the wiper arm is moved from the mid-rotation position toward the upper fixed tap 5 (maximum-boost position) of potentiometer $R_3$, the bass-frequency signal level is increased because the impedance of the signal path decreases for the bass frequencies while remaining relatively constant (because of the constant-impedance path provided by the capacitors $C_1$ and $C_2$) for the mid-range and treble frequencies. As the wiper arm of potentiometer $R_3$ is moved toward the lower fixed tap 6 (maximum-cut position) of potentiometer $R_3$, the impedance of the bass signal is increased thereby reducing the sibnal level of the bass frequencies relative to the mid-range and treble frequencies.

Thus the "universal" bass tone control provides the desired bass-boost and cut effects. Continuous control of cut and boost is provided within a signal level span of approximately plus or minus 20 decibels. However, this circuit has the inherent disadvantages of the attenuation and boost values being interdependent and the turnover frequency remaining constant for different control settings. Consequently, this conventional tone control circuit does not compensate for the high-volume-level, tonal-response peculiarities of the human ear.

Figure 2:
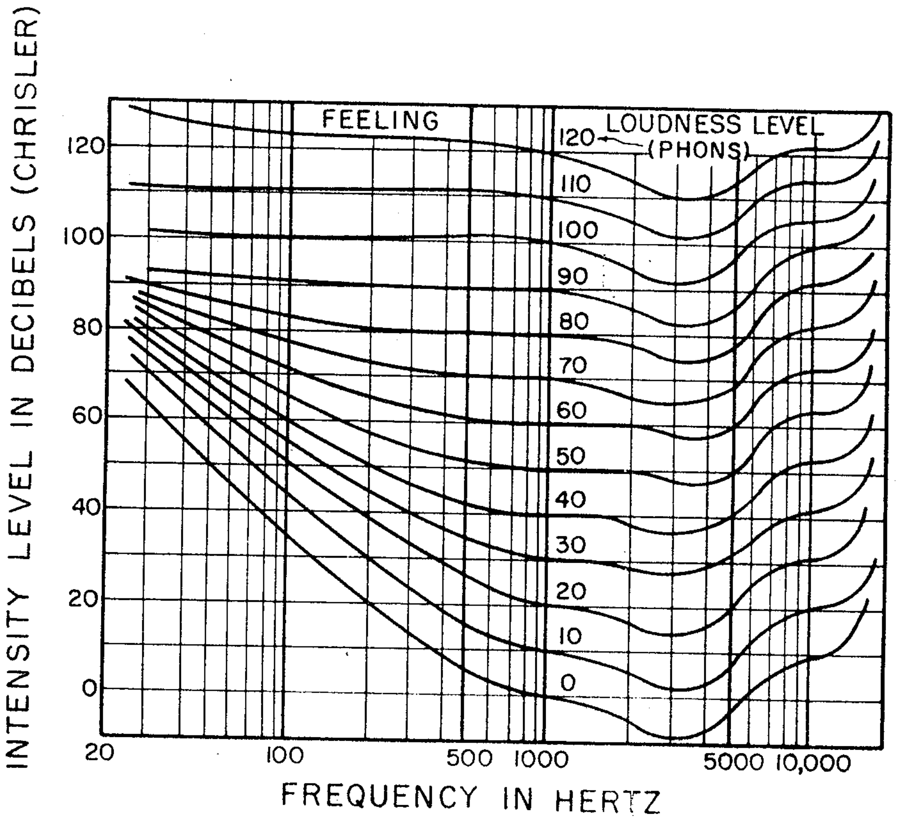
FIGURE 2 is a graphical representation of a family of equal-loudness contours.

The curves shown in FIGURE 2 are the well-known Fletcher-Munson curves which represent the average hearing characteristics of the human ear. The curves were compiled by testing a large number of individuals and averaging the results. Each curve is an equal-loudness curve; that is, each curve represents the average intensity of sound required for a human ear to hear each respective frequency in the audio frequency spectrum at an equal degree of loudness. As a practical matter, most sound levels encountered in a private home fall in the range of 40 to 80 phons. From the curves it can be seen that at relatively high levels of loudness (70 phons) the sensitivity of the ear is such that only frequencies within the 20 to 200 hertz range require any emphasis. However, at relatively low volume levels (50 phons) the sensitivity of the ear requires the frequencies in the 20 to 500 hertz range to be boosted. Hence, merely boosting the entire bass frequency range, as the aforementioned conventional control does, is inadequate as it leaves the listener in a dilemma. If he maintains the conventional control at the maximum-boost position, he obtains adequate emphasis of the 20 to 200 hertz range, the 200 to 500 hertz range is overemphasized and the listener must endure "muddy bass." If he turns the conventional control down until the "muddy bass" situation is corrected, the 20 to 200 hertz range is insufficiently emphasized and an unnatural sound reproduction results.

Figure 3:
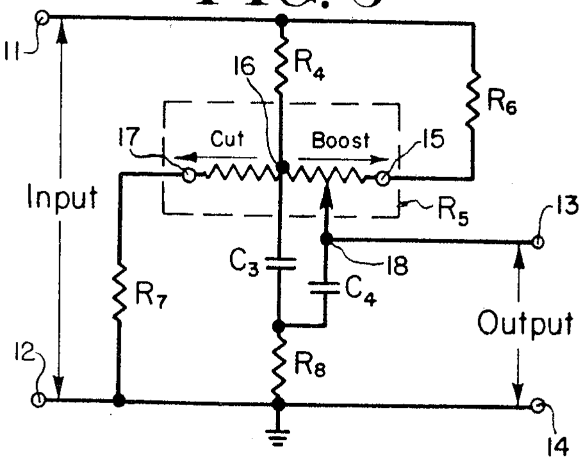
FIGURE 3 is a schematic diagram of one embodiment of the invention.

A circuit embodying the present invention which enables the listener to "have his cake and eat it too" is shown in FIGURE 3. An audio frequency signal is applied to input terminals 11 and 12, and the output signal is developed between a pair of output terminals 13 and 14. Input terminal 12 and output terminal 14 are grounded. A resistor $R_6$ is connected between input terminal 11 and one fixed end tap 175 of a potentiometer $R_5$. Another resistor $R_4$ is connected between input terminal 11 and an intermediate fixed tap of potentiometer $R_5$. This intermediate tap 16 is preferably situated such that it simultaneously corresponds to the 60% rotation position of the potentiometer and the 50% value of the resistance of the potentiometer. Such a construction permits a greater degree of control of the amount of bass-boost as it utilizes 40% of the mechanical rotation of the potentiometer to encompass 50% of the resistance of the potentiometer. The values of resistors $R_4$ and $R_6$ are made small relative to the resistance of the potentiometer. Furthermore, the value of each portion of the resistance of the potentiometer between adjacent fixed taps is preferably large compared to the values of resistors $R_4$ and $R_6$. In this embodiment, the remaining fixed end tap 17 is connected to ground through a resistor $R_7$. A series combination of a capacitor $C_3$ and a resistor $R_8$ is connected between fixed tap 16 and ground such that one terminal of the capacitor $C_3$ is connected to fixed center tap 16. Variable tap 18 (the wiper arm) is directly connected to output terminal 13. An additional capacitor $C_4$, which preferably has a smaller value than capacitor $C_3$, is connected between variable tap 18 and the junction of resistor $R_8$ and capacitor $C_3$.

The operation of the inventive circuit shown in FIGURE 3, can be more easily understood by analyzing three special cases of the present invention corresponding to three settings of the variable-turnover-frequency bass control: maximum boost, 60% rotation, and minimum boost.

Figure 4:
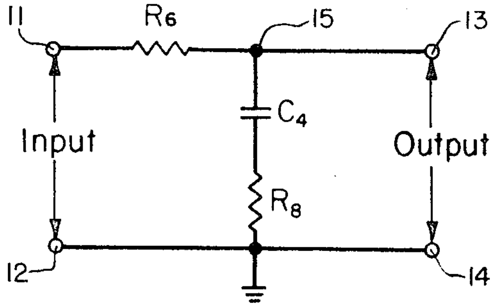
FIGURE 4 is a schematic diagram of a simplified equivalent circuit of the illustrated embodiment of the invention when the bass tone control is set at the maximum-boost position.

In the maximum-boost setting, the inventive circuit shown in FIGURE 3 simplifies to the equivalent circuit illustrated in FIGURE 4. Audio frequency signals are applied to input terminals 11 and 12 and the output signals are derived at output terminals 13 and 14. With the wiper arm of the potentiometer at the maximum-boost position, the impedance of the series circuit of resistor $R_6$, capacitor $C_4$, and resistor $R_8$ is much lower than that of any other signal path in the inventive circuit and, therefore, it determines the operation of the circuit. The resulting simplified equivalent circuit is a frequency-selective voltage divider network comprising resistor $R_6$ and the series combination of capacitor $C_4$ and resistor $R_8$. The turnover frequency and the magnitude of the shunting effect by capacitor $C_4$ and resistor $R_8$ on the mid-range and treble frequencies are determined by the values of the capacitor $C_4$ and resistor $R_8$. These two values are preferably proportioned to effect a turnover frequency of 400 hertz.

Figure 5:
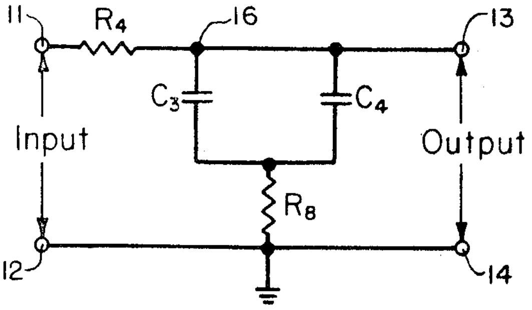
FIGURE 5 is a schematic diagram of a simplified equivalent circuit of the illustrated embodiment of the invention when the bass tone control is set at the 60% rotation (center tap) position.

With the variable tap 18 positioned at the 60% rotation setting, the variable tap coincides with the center tap 16 and the inventive circuit simplifies to the circuit shown in FIGURE 5. Again, this circuit is derived by determining the lowest-impedance signal path which, in this case, is the series combination of the resistance provided by the resistor $R_4$, the capacitance consisting of the parallel combination of capacitors $C_3$ and $C_4$, and the resistance of resistor $R_8$. The remaining portion of the inventive circuit is not considered as it is of such a high impedance that it does not materially affect the input signals at this control setting. Thus, another voltage divider network is established similar to the one shown in FIGURE 4. However, the shunt capacitance in this case is greater because it is composed of the parallel combination of capacitors $C_3$ and $C_4$.

In operation, the circuit shown in FIGURE 5 operates in a manner similar to the circuit shown in FIGURE 4. Once again an input signal is applied to input terminals 11 and 12 and an output signal is derived at output terminals 13 and 14. The increase in the shunt capacitance, however, produces two effects. It provides a smaller impedance to bass frequencies which reduces the signal level of the bass frequencies relative to the mid-range and treble frequencies. It also shifts the turnover frequency of the circuit to a lower frequency. The value of capacitor $C_3$ is preferably chosen such that when it combines with capacitor $C_4$ at the 60% rotation control setting, the turnover frequency of the circuit is approximately 200 hertz.

Figure 6:
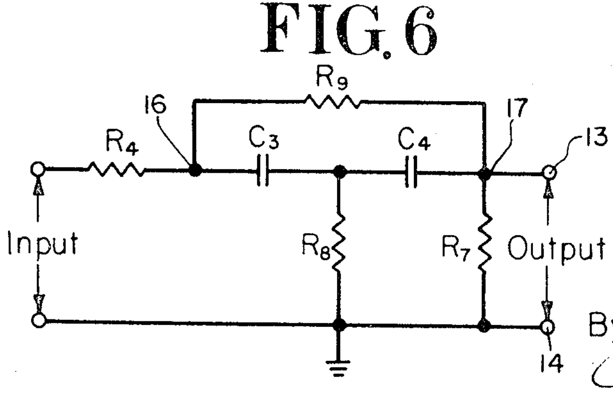
FIGURE 6 is a schematic diagram of a simplified equivalent circuit of the illustrated embodiment of the invention when the control is set at the maximum-cut position.

The third special case constitutes the situation in which the variable-turnover-frequency bass tone control is set at the maximum-cut position. Here the inventive circuit of FIGURE 3 simplifies to the equivalent circuit shown in FIGURE 6. The resistor $R_9$ represents the portion of the resistance of potentiometer $R_5$ between taps 16 and 17 and is large relative to $R_4$ and is in series with $R_4$. The resistance of $R_4$ is made small compared to the rest of the circuit so that the other portion of the potentiometer resistance and $R_6$ have a negligible effect on the operation at this setting. The equivalent circuit shown is easily recognized as the well-known bridge-T circuit which is a notch filter. The notch is placed at the approximate middle of the bass range of frequencies by selecting the appropriate values of resistors $R_7$, $R_8$, $R_9$ and capacitors $C_3$ and $C_4$, thus providing a bass-cut effect.

Figure 7:
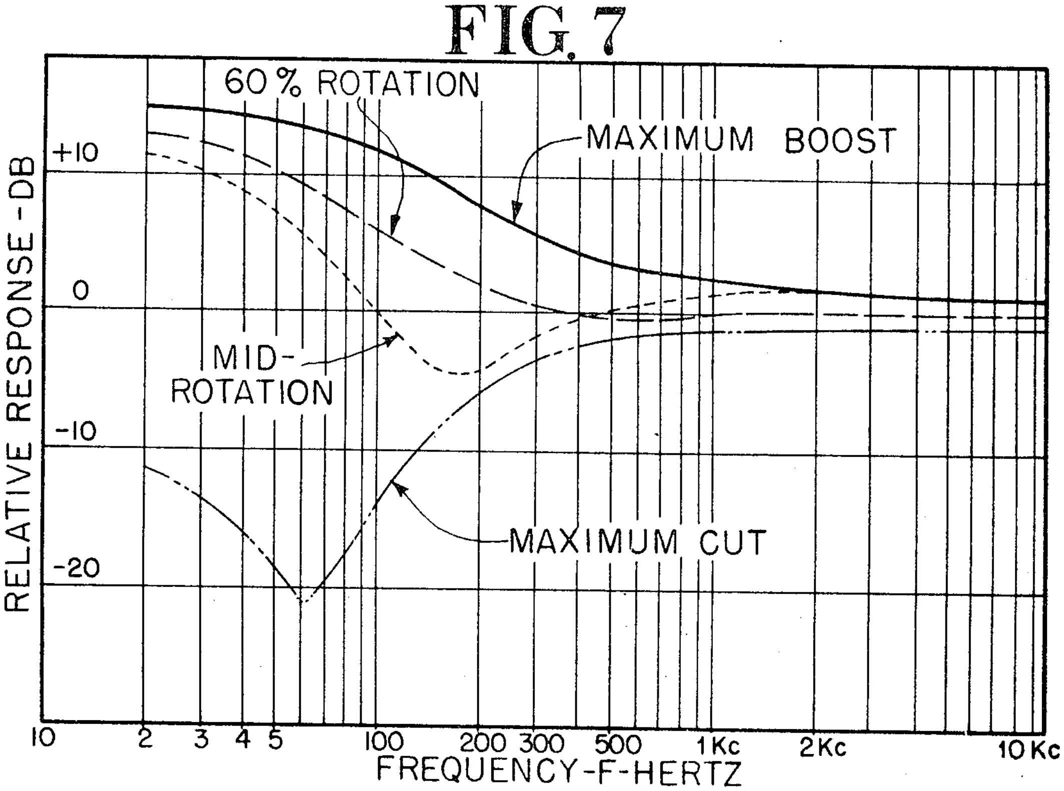
FIGURE 7 is a graphical representation of the operating characteristics of the illustrated embodiment of the invention.

In FIGURE 7, typical operational characteristics of the embodiment of the inventive circuit shown in FIGURE 3 are illustrated. Merely by way of illustration and in no sense by way of limitation, the operating characteristics of FIGURE 7 were obtained by employing the following component values in the circuit of FIGURE 3.

| | |
|---|---|
| Resistor $R_4$, ohms | 56,000 |
| Resistor $R_6$, ohms | 75,000 |
| Resistor $R_7$, ohms | 22,000 |
| Resistor $R_8$, ohms | 4,700 |
| Capacitor $C_3$, microfarads | 0.10 |
| Capacitor $C_4$, microfarads | 0.033 |
| 60%-tapped potentiometer $R_5$, total ohms | 500,000 |

The frequency response of the variable turnover-frequency bass tone control utilizing the above component values is plotted on the graph for each of the three special cases previously discussed plus one additional curve corresponding to the mid-rotation control setting. Considering the signal level of each response curve at 1,000 hertz to be the mid-range signal level for each respective control setting, it is apparent from the graph that the turnover frequency of the control for the mid-rotation setting is approximately 70 hertz; 60% setting 200 hertz; and maximum boost, 400 hertz. The maximum-cut setting affords an adequate bass-cut effect of 21 decibels and the maximum-boost position provides 15 decibels of bass boost.

Thus the disclosed invention provides a new and improved continuously variable tone control which is particularly suited to audio high fidelity amplifiers and has substantial advantages over predecessor circuits. It provides for continuous variation of the signal level of the bass frequencies over a substantial range (e.g. from a maximum de-emphasis of 21 decibels to a maximum emphasis of 15 decibels) and in addition, provides an expanding range of boosted bass frequencies as the control is moved from the mid-rotation position to the maximum-boost position. The circuitry involved is simple and relatively inexpensive in employing no active elements or switches, thus making the invention highly desirable for consumer products use.

While a particular embodiment of the invention has been shown and described, it will be obvious to those skilled in the art that changes and modifications may be made without departing from the invention in its broader aspects.

I claim:

1. An audio tone control circuit for providing a bass-boost effect over different portions of the tonal response range for different control settings, said circuit comprising:

first and second input terminals for receiving an audio frequency signal;

a potentiometer having two end taps, a fixed intermediate tap, and a variable tap;

a first resistor DC coupled between said first input terminal and one of said end taps;

the other of said end taps coupled to said second input terminal;

a second resistor DC coupled between said first input terminal and said fixed intermediate tap;

a network comprising a capacitance and a resistance coupled in series between said fixed intermediate tap and said second input terminal;

and means including an additional capacitor and said resistance for coupling said variable tap to said second terminal;

whereby there is developed between said variable tap and said second input terminal an audio output signal in which the frequency range of said bass-boost effect is dependent on the setting of said variable tap.

2. An audio tone control circuit comprising:

first and second input terminals for receiving an audio frequency input signal;

a potentiometer having two end taps and at least one fixed intermediate tap and also having a variable tap adjustable throughout the range between said end taps;

a first resistor coupled between said first input terminal and one of said fixed end taps;

a second resistor coupled between said first input terminal and said fixed intermediate tap;

a third resistor coupled between the other of said end taps and said second input terminal;

a network comprising a capacitance and a first resistance coupled in series between said fixed intermediate tap and said second input terminal;

and means including a second capacitor and said first resistance for coupling said variable tap to said second terminal;

whereby an audio output signal is developed between said variable tap and said second input terminal, the bass components of said audio output signal being either emphasized or de-emphasized relative to other components of said audio input signal dependent upon the setting of said variable tap, and when emphasized having a turnover frequency which is also dependent upon the setting of said variable tap.

3. A tone control circuit in accordance with claim 2, in which said first and second resistors are each small relative to the resistance of said potentiometer.

4. A tone control circuit in accordance with claim 2, in which said second capacitor is smaller than said first capacitor.

5. A tone control circuit in accordance with claim 2, in which the resistance of each portion of said potentiometer between adjacent fixed taps is large relative to the resistances of each of said first and second resistors.

References Cited

UNITED STATES PATENTS 2,900,609 8/1959 Estkowski.

HERMAN KARL SAALBACH, Primary Examiner

PAUL L. GENSLER, Assistant Examiner

U.S. Cl. X.R.

179—1